United States Patent [19]

Shibata

[11] Patent Number: 5,151,651
[45] Date of Patent: Sep. 29, 1992

[54] APPARATUS FOR TESTING IC ELEMENTS

[75] Inventor: Junichirou Shibata, Urawa, Japan

[73] Assignees: Tokyo Electron Limited, Tokyo; Tokyo Electron Yamanashi Limited, Nirasaki, both of Japan

[21] Appl. No.: 728,275

[22] Filed: Jul. 11, 1991

[30] Foreign Application Priority Data

Aug. 16, 1990 [JP] Japan .................................. 2-216188

[51] Int. Cl.⁵ .......................................... G01R 31/00
[52] U.S. Cl. .............................. 324/158 P; 324/158 F
[58] Field of Search ............... 324/158 F, 158 P, 72.5; 439/482, 68, 69, 70

[56] References Cited

U.S. PATENT DOCUMENTS

| | | | |
|---|---|---|---|
| 4,719,417 | 1/1988 | Evans | 324/158 P |
| 4,987,365 | 1/1991 | Shreeve et al. | 324/158 P |
| 4,996,476 | 2/1991 | Balyasny et al. | 324/158 F |
| 5,049,813 | 9/1991 | Van Loan et al. | 324/158 P |

*Primary Examiner*—Vinh Nguyen
*Attorney, Agent, or Firm*—Oblon, Spivak, McClelland, Maier & Neustadt

[57] ABSTRACT

An apparatus for testing IC elements each having an upper mold and leads includes a holding section for holding the IC elements, a contact section having contact to be contacted with the leads of the IC elements and a supporting member for supporting the probes, a lift mechanism for causing the holding section and the contact section to approach each other and contact them each other, and a mold guide provided adjacent the supporting member and movable toward it. The mold guide includes an edge portion formed with grooves for receiving the probes, and a bottom face and inner faces for aligning the IC elements with the mold guide.

29 Claims, 5 Drawing Sheets

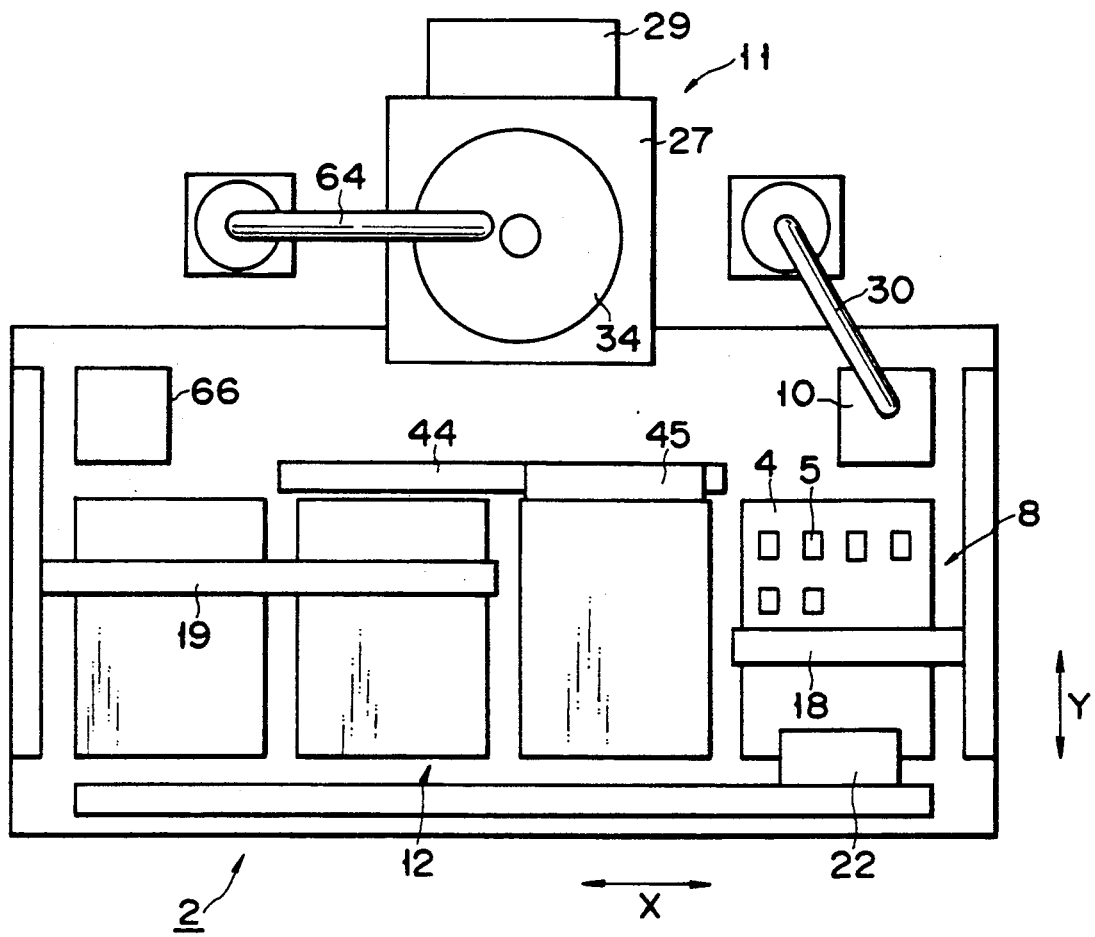
F I G. 1
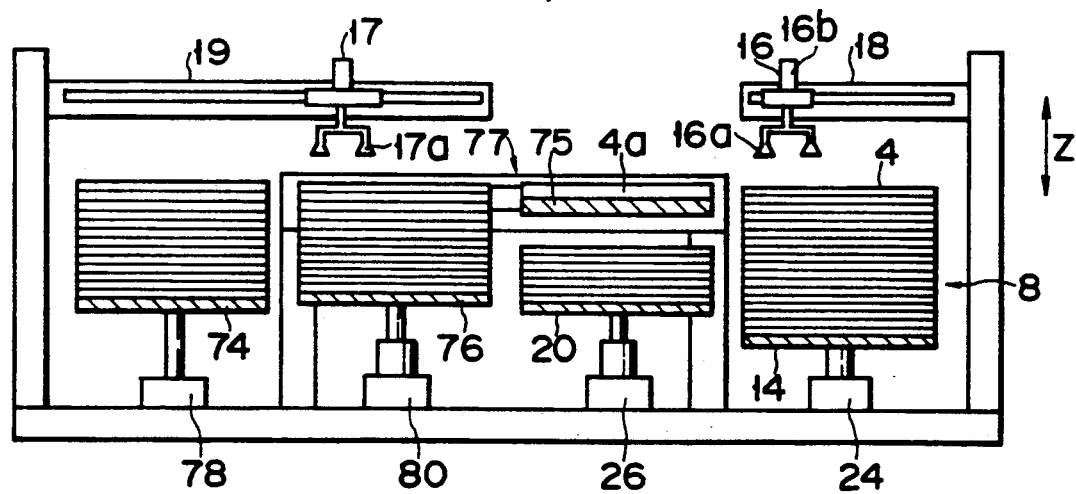
F I G. 2

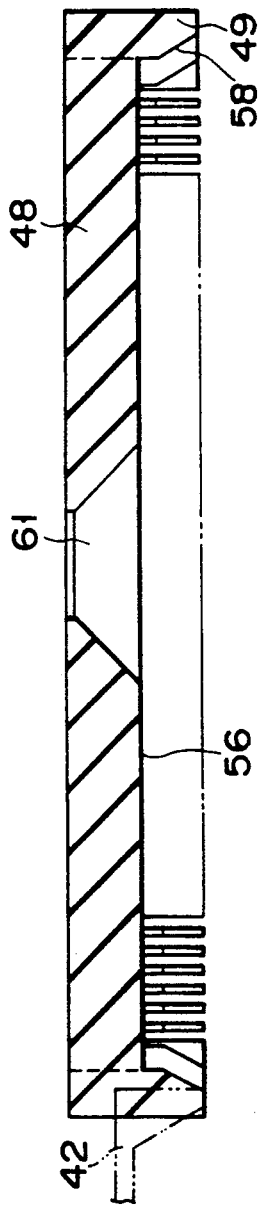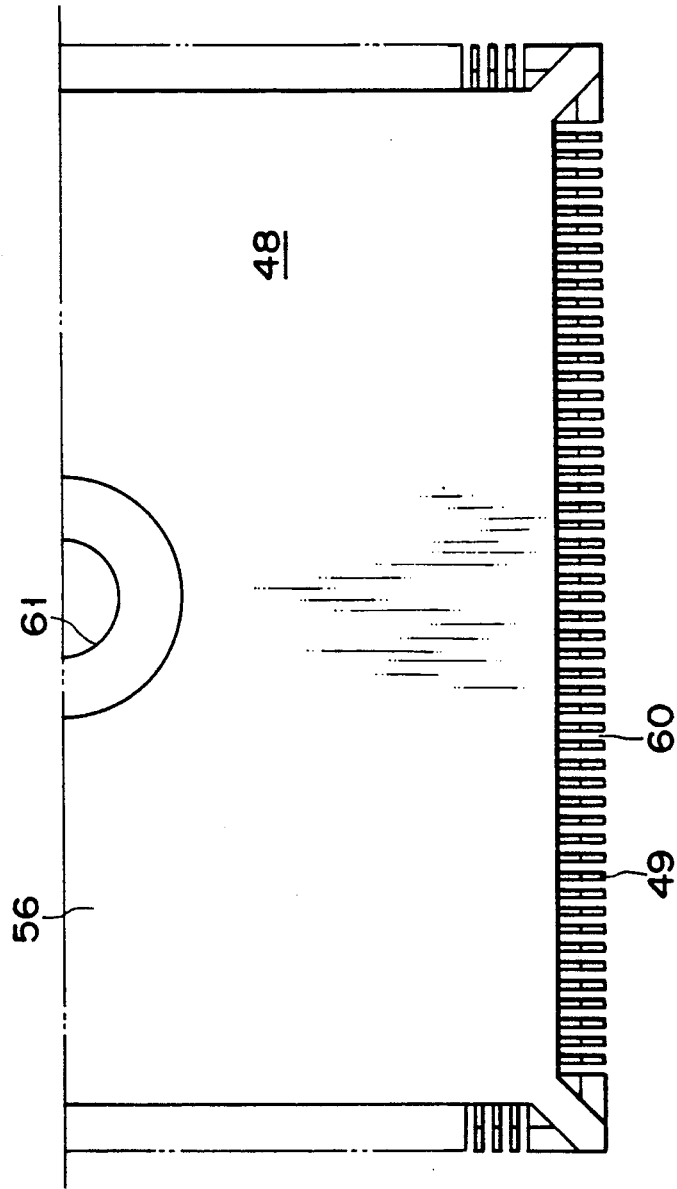

APPARATUS FOR TESTING IC ELEMENTS

BACKGROUND OF THE INVENTION

1. Field of the Invention

This invention relates to an apparatus for testing electrical characteristics of IC elements, and more particularly to an apparatus for testing IC elements having leads of a pitch of 0.5 mm or more.

2. Description of the Related Art

There have frequently been used handlers each of which automatically supplies assembled IC elements to a testing unit for discriminating the electrical characteristics of the IC elements and automatically selects or classifies them according to the detected nature of them. The IC handlers are of two types, one being a socket type and the other being a contact type when they are classed by the contacting ways of the leads of IC elements with test heads. The socket type IC handler uses the method in which the leads of IC elements to be tested are inserted in sockets to be connected to a tester for checking the electrical characteristic of the IC elements, and the contact type IC handler is designed to discriminate the electrical characteristics of IC elements to be tested by contacting the probes connected to a tester with the leads of the IC elements.

With the socket type IC handler, the leads of IC elements are inserted in sockets after the leads have been aligned with the sockets. The handler of this type is encountered with the problem that the leads would be likely to be bent. In order to eliminate this problem, it is necessary to insert the leads in the sockets at a low speed, making it difficult to test the electrical characteristics of the IC elements at a short time.

With the typical contact type IC handler, the surface of the leads of IC elements would be likely to be damaged or the leads would be bent when the probes are strongly pressed against the leads. These problems must be avoided by contacting the probes with the leads at a low speed. With the contact type IC handler, therefore, the test time of the electrical characteristics of IC elements cannot be shortened, either.

SUMMARY OF THE INVENTION

The object of this invention is to provide an apparatus for testing IC elements which can tests electrical characteristics of IC elements at a short time without damaging and bending the leads of the IC elements.

In order to attain the object, an apparatus for testing IC elements comprises holding means for holding an IC element, a contact section having probes to be contacted with the leads of the IC element and supporting means for supporting the probe, contact means for causing the holding means and the contact section to approach each other and the leads of the IC element and the probes to contact with each other, and a mold guide provided adjacent the supporting means and movable toward the same, the mold guide having edge portions formed with grooves for receiving the probes and aligning means for aligning the IC element with the mold guide when the leads of the IC element contact the probes.

When IC elements each having an upper mold and leads are electrically tested by the IC testing apparatus according to this invention, the leads of coarsely aligned IC elements are loaded on the holding means and this means is lifted. As the IC elements are raised, the upper molds of the IC elements are fitted in the mold guide formed in accordance with the shape of the upper molds of the IC elements such that an accurate alignment is established without contacting the leads of the IC elements with the mold guide.

In the edge portion of the mold guide are formed grooves disposed corresponding to the position of the leads of the IC elements, and the probes received in the grooves contact the leads of the IC elements. As the holding means is further lifted, urging means which is urging the mold guide shrinks and is over-driven together with the IC elements, whereby the leads and the probes firmly contact each other.

In the IC testing apparatus according to this invention, the probes only contact the root portions of the leads which have a relatively high strength, and thus the leads would not be bent.

Further, a high indexing movement is made by loading a plurality IC elements on the holding means such that high throughput is established by this invention which cannot be attained by the prior art handler.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a top plan view of an IC testing apparatus according to one embodiment of this invention;

FIG. 2 is a front view of the IC testing apparatus of FIG. 1;

FIGS. 6A and 6B are a longitudinal cross-sectional view and a bottom view of the mold guide, respectively;

DETAILED DESCRIPTION OF THE PREFERRED EMBODIMENTS

Figure 3:
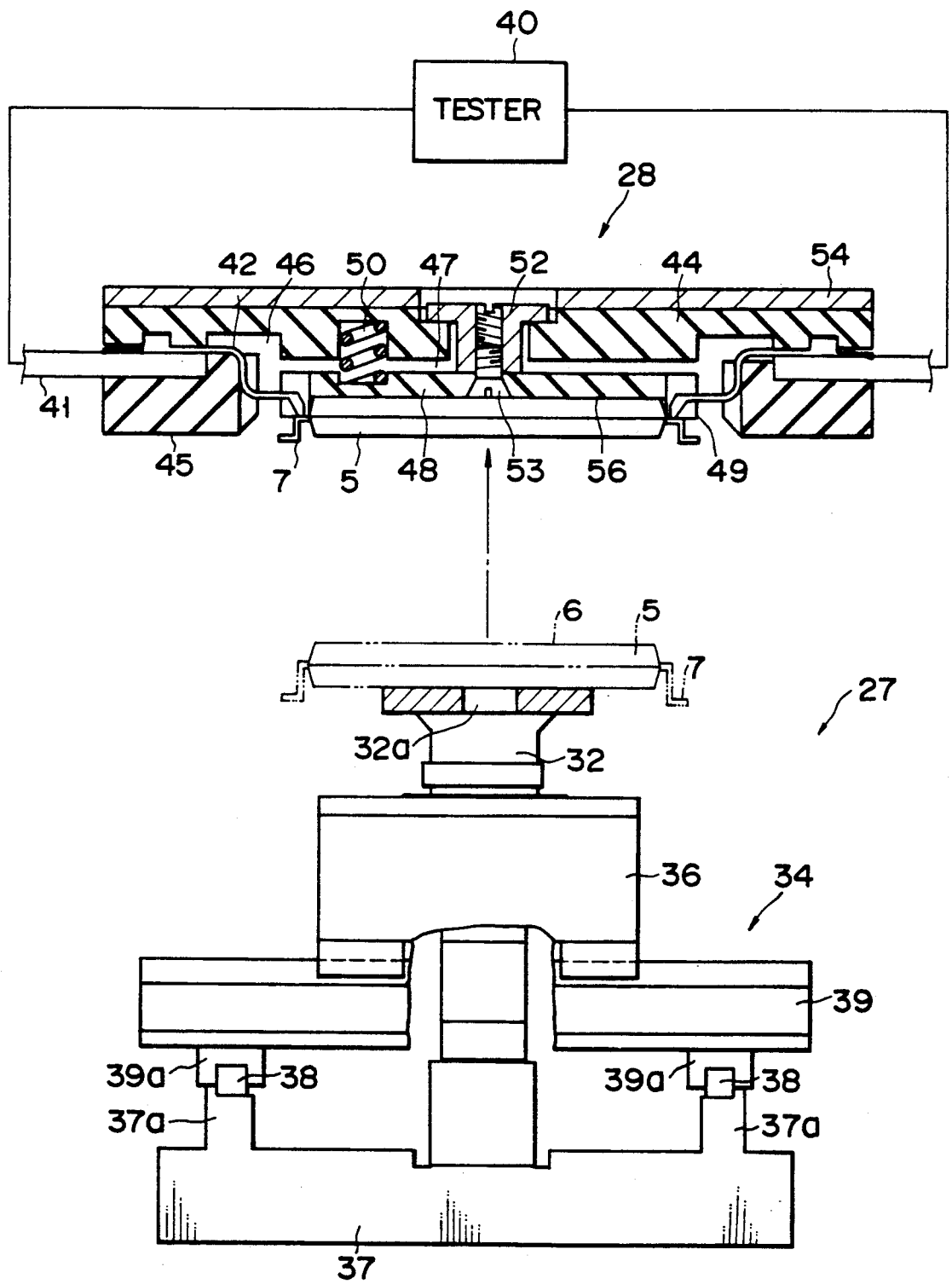
FIG. 3 is a side view of the IC testing apparatus of FIG. 1, with a portion partially cross-sectioned.

This invention will now be described by way of embodiments with reference to the drawings.

As shown in FIG. 1, an IC element testing apparatus 2 according to one embodiment of this invention comprises a loader section 8 for loading trays 4 on which are mounted IC elements 5 such as flat package type IC elements each having an upper mold 6 and leads 7, an alignment section 10 for making coarse alignment of IC elements 5 transported from the loader section 8, an IC element testing section 11 for testing the electrical characteristics of the IC elements 5 coarsely aligned on the alignment section 10, and a reception section 12 for receiving the tested IC elements 5 unloaded from the IC testing section 11.

In FIG. 2, the loader section 8 is provided with a vertically movable waiting tray table 14 on which trays 4 containing IC elements 5 to be tested are stacked. Above the waiting tray table 14 is disposed a first robot arm 18 which includes a pickup unit 16 driven by means of a pulse motor (not shown) in the rightward and leftward directions as well as in the frontward and rearward directions (X-Y directions). The pickup arm unit 16 comprises a pair of suction elements 16a and an air cylinder 16b for moving the suction elements 16a in Z directions (in the vertical directions). When, therefore, the IC elements on the tray 4 are picked up, the pickup unit 16 is moved in the required X-Y direction so as to position the suction elements 16a over the IC elements to be picked up and then the suction elements 16a are lowered to the IC elements. The sucked IC elements 5 are lifted by the air cylinder 16b and transported to the alignment section 10 by moving the first robot arm 18 in the suitable X-Y direction.

In the range of the reception section 12, an empty tray table 20 is disposed adjacent the loader 8. In parallel to the loader 8 and the reception section 12 is provided a third robot arm 22 which can driven in the transverse directions (X directions). After all IC elements 5 have been delivered from the top trays 4 on the waiting tray table 14 to the IC testing section 11 through the alignment section 10 and thus the top trays 4 have become empty, the empty trays 4 are moved to the empty tray table 20 by means of a pickup unit (not shown) of the third robot arm 22.

The waiting tray table 14 is securely mounted on a vertical drive mechanism 24 movable vertically by means of a pulse motor (not shown), and the empty tray table 20 is also securely mounted on a vertical drive mechanism 26 which makes a predetermined vertical stroke movement by means of a pulse motor (not shown) and fine vertical adjustment by means of an air cylinder (not shown). After the empty trays 4 are transferred onto the empty tray table 20 by means of the third robot arm 22, the waiting tray table 14 is lifted by the amount equal to the height of a tray, on one hand, and the empty tray table 20 is lowered by the same amount, on the other hand. After the lifting and the lowering of the tables 14 and 20 have been completed, IC elements 5 on the new top trays 4 on the waiting tray table 14 starts to be moved to the alignment section 10 by means of the first robot arm 18.

Figure 4:
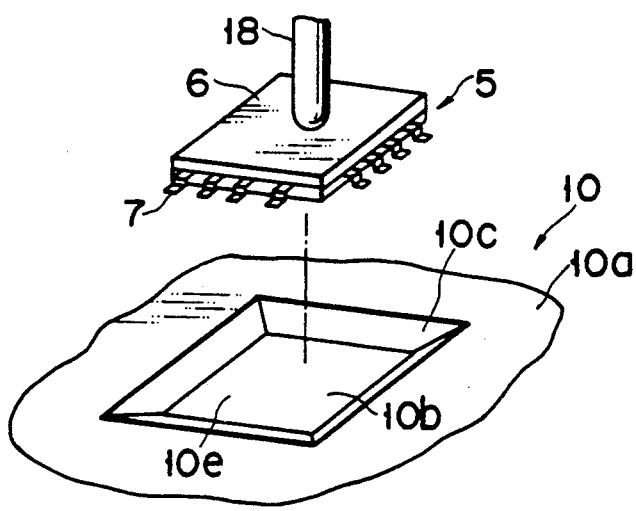
FIG. 4 is a perspective view of the alignment stage of FIG. 1.

As shown in FIG. 4, the alignment section 10 has a coarse adjustment stage 10a having coarse alignment depressions 10b shaped in correspondence with the shape of the leads of IC elements 5. When the external configuration of each IC element 5 is rectangular, the depression 10b has four inclined planes 10c corresponding to the shape of the IC element 5. The IC elements 5 sucked by the first robot arm 8 with the leads directed downward are transported onto the alignment stage 10a. The IC elements 5 released there fall by their own weight along the inclined planes 10c defining the coarse alignment depressions 10b. When the IC element 5 reaches the bottom face 10e of the coarse alignment depression 10b, the coarse alignment is completed.

The IC elements 5 which have coarsely aligned are picked up by means of a fourth robot arm 30 and delivered to the IC element testing section 11. The IC element testing section 11 comprises an IC testing stage 27, a contact unit 28 and a controller 29.

As shown in FIG. 3, the IC testing stage 27 comprises a chuck 32 which is a holder of the IC elements 5, and an X-Y-Z-$\theta$ table 34. The X-Y-Z-$\theta$ table 34 comprises a base 37, a Y-direction rail 38 fixed to supporting portions 37a of the base 37, an X-direction rail 39 mounted on the Y-direction rail 38 via engaging portions 39a, a moving mechanism 36 for moving the chuck 32 in the X directions and in $\theta$ directions. The moving mechanism 36 is constructed such that it rotates the chuck 32 by means of a motor (not shown) and moves it vertically by means of a ball screw mechanism (not shown). A suction port 32a formed in the chuck 32 is connected to a vacuum pump (not shown) so as to suck and hold the respective IC element 5.

Over the chuck 32 is disposed the contact unit 28 provided with probe cards 41 connected to a tester 40 for testing the electrical characteristics of IC elements 5. To the probe card 41 are connected, in a gas-tight state, a plurality of probes 42 at a pitch of the leads 7 of the IC element 5, for example, at a pitch of 0.5 mm. The probe card 41 is fixed to the main body of the IC testing section 11 by means of a positioning pin (not shown) and a screw (not shown) so that the card 41 can easily be exchanged at a short time.

Figure 7:
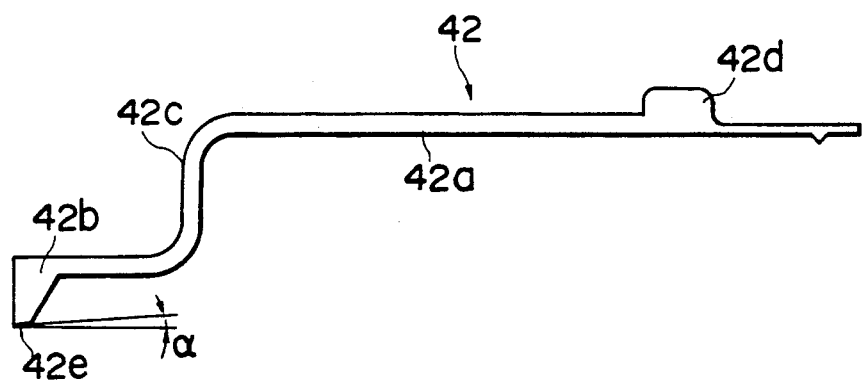
FIG. 7 is a side view of the probe.

As shown in FIG. 7, the probe 42 has a shaft portion 42a joined to the probe card 41, and a tip portion 42b contacting with the respective lead of an IC element 5. A crank portion 42c showing a high spring property in the vertical directions is formed between the shaft portion 42a and the tip portion 42b. A positioning projection 42d is formed in the vicinity of the root of the shaft portion 42a. The contact face 42e of the tip portion 42b contacting with a lead 7 of an IC element 5 is inclined at an angle of $\alpha$ with respect to a plane parallel to the shaft 42a in order to contact the lead 7 with the contact face 42e well. The angle $\alpha$ is $5°\pm25'$ in this embodiment but it may be 3° to 10°. The contact face 42e and the shaft portion 42a have an area of 60 to 200 $\mu$m square and an area of 0.2 mm square, respectively.

The probe cards 41 and the probes 42 are held between an upper support 44 and a lower support 45 included in the contact unit 28 and are fixed by them. Between the probes 42 and the upper support 44 is defined an operation space 46 for permitting the probes 42 to be bent upward when the probes 42 are overdriven after they have contacted with the leads 7 of the IC elements 5. Decoupling condensers (not shown) are arranged in the vicinity of the probes 42.

Under the upper support 44 is placed a mold guide 48 made of synthetic resin with a gap of a predetermined width left therebetween. Springs 50 as urging members are disposed between the mold guide 48 and the upper support 44. The mold guide 48 is mounted on the upper support 44 by means of a fixing member 52 and a countersunk bolt 53 so as to be adjusted vertically. The upper support 44 is fixed to the frame 54 of the contact unit 28.

Figure 5:
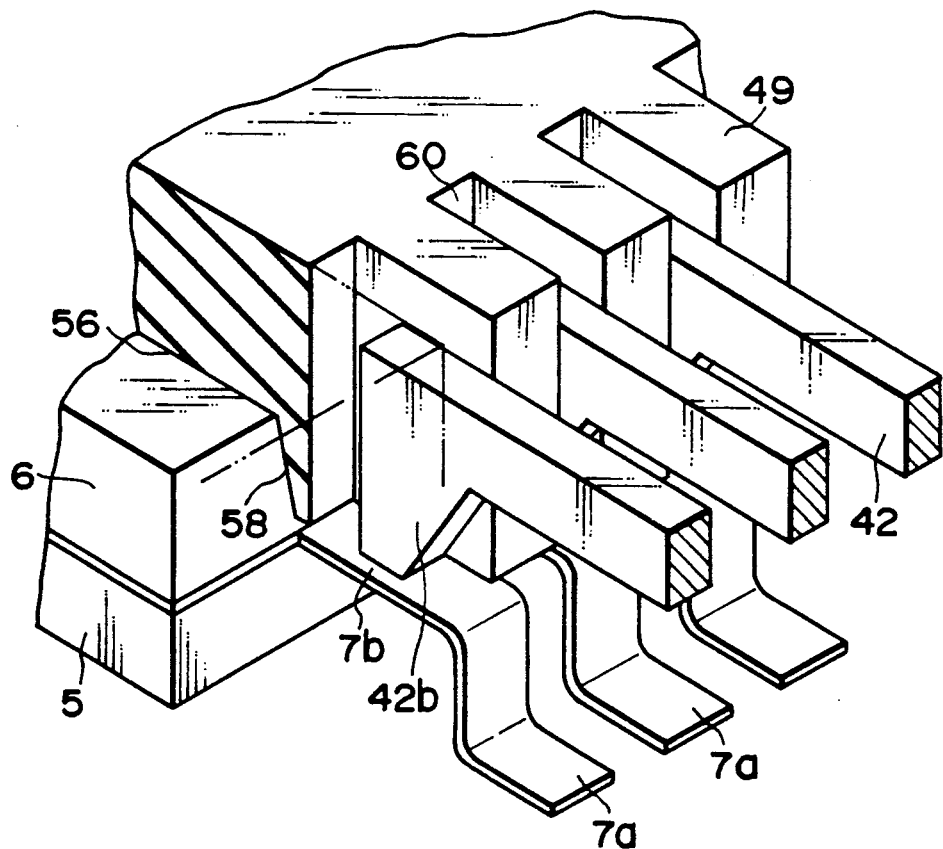
FIG. 5 is a perspective view showing a state in which an IC element and a prove are in contact with each other.

The mold guide 48 includes a bottom face 56 closely contacting with the upper molds 6 of the IC elements 5, as shown in FIGS. 6A and 6B, when the chucks 32 holding the IC elements 5 are lifted, and the mold guide 48 also includes an inner face 58 having the corresponding shape of the upper mold 6, as shown in FIGS. 5 and 6A. In the edge portion 49 having an inner face 58 are formed grooves 60 corresponding to the number and the shape of the leads 7. As shown in FIG. 5, a probe 42 has been previously introduced in the corresponding groove 60 such that the probe 42 contacts the respective lead 7 not on the tip 7a but on the root 7b. A fixing screw hole 61 is formed in the central portion of the mold guide 48. The material of the mold guide 48 is not limited to synthetic resin but it may be any electrically insulating material.

In the controller 29 of the IC testing section 11 are housed a CPU and memories (not shown) electrically connected to the tester 40. The IC element testing section 11 determines whether IC elements 5 having their leads 7 contacted with the probes 42 are acceptable (good), unacceptable (no good) or to be retested and these results are stored in the memories in the controller 29. The tested IC elements 5 are unloaded from the testing stage 27 and transferred to an inversion stage 66 by means of a fifth robot arm 64. On the inversion stage 66, the IC elements are rotated through 180° by means of a motor (not shown) so as to be inverted.

The IC elements inverted on the inversion stage 66 are picked up by means of a second robot arm 19, having suction elements 17a and a pickup unit 17 like the first robot arm 19, and are transported onto and received by the trays in the reception section 12 which are classified according to the information recorded in the memories from the IC elements. In the reception section 12 are provided an accepted IC element tray table 74 and an unaccepted IC element tray table 76 which receive classified IC elements, that is, accepted IC elements and unaccepted IC elements, respectively. The accepted IC element tray table 74 is mounted on a vertical drive mechanism 78 vertically moved by means of a pulse motor (not shown), and the unaccepted IC element tray table 76 is mounted on a vertical drive mechanism 80 which is vertically rendered to make a predetermined vertical stroke by means of a pulse motor (not shown) and a vertical fine adjustment by means of an air cylinder (not shown).

When the top trays mounted on the accepted IC element tray table 74 and the unaccepted IC element tray table 76 are filled with the tested IC elements 5, both accepted and unaccepted IC element tray tables 74 and 76 are lowered by means of the vertical drive mechanisms 78 and 80 by the amount equal to the height of a tray, and then empty trays on the empty tray table 20 are transformed by means of the third robot arm 22 to the accepted IC tray table 74 and the unaccepted IC tray table 76, in turn.

The operation of the IC testing apparatus according to the embodiment of this invention as mentioned above will now be explained.

Trays 4 filled with IC elements 5 are located on the loader 8 and then the IC elements 5 are sucked and transported to the alignment section 10 by means of the first robot arm 18. As the IC elements 5 are released from the first robot arm 18 on the coarse alignment stage 10a of the alignment section 10, the IC elements 5 slide on the inclined faces 10c and coarsely aligned on the bottom faces 10e of the alignment stage 10a. Thereafter, the coarsely aligned IC elements 5 are sucked by means of the fourth robot arm 30 and are transmitted onto the chuck 32 of the testing stage 27. The IC elements 5 are temporarily fixed to the chuck 32 by means of a vacuum device (not shown) and moved right under the contact section 28 by means of the X-Y-Z-$\theta$ table 34, and then the IC elements are lifted together with the table 34 by means of the moving mechanism 36.

In the next step, the IC elements 5 are raised until the upper molds 6 are closely contacted with the bottom faces 56 of the mold guide 48 such that the IC elements are snugly received by the mold guide 48, and consequently the IC elements 5 are set to an accurate aligned position. In this state, the probes 42 having the tip portions 42b inserted in the grooves 60 formed in the edge portions 49 of the mold guide 48 contact the roots 7b of the leads 7 of the IC elements 5. As the chuck 32 is over-driven by being raised, the spring 50 disposed between the mold guide 48 and the upper support 44 is compressed to insert the mold guide 48 into the space 47. The probes 42 are also lifted and inserted into the space 46. As a result, the tip portion 42b of the probe 42 contacts the root 7b of the corresponding lead 7 at a required pressure and the edge of the tip portion 42b breaks the naturally oxidized film on the lead 7 to allow probe 42 to be in good electrical contact with the lead 7.

The results of the test of the electrical characteristics of the IC elements 5 made by means of the IC testing section 11 are stored in the memories in the controller 29. The tested IC elements 5 are moved by means of the fifth robot arm 64 to the inversion stage 66 and inverted thereon. Of the inverted IC elements, the ones which were determined as being accepted are picked up and transferred to the trays on the accepted IC element tray table 74 by means of the second robot arm 19. The IC elements which were determined as being unaccepted and are inverted on the invention table 66 are picked up and moved to the unaccepted tray table 76 by means of the second robot arm 19.

When the inverted IC elements which were judged as being to be retested, the unaccepted IC element table 76 is lowered by the amount equal to the predetermined stroke by means of the vertical drive mechanism 80 and a retest IC tray table 75 is moved onto the unaccepted IC tray table 76 by means of a horizontal drive mechanism 77. Then, the empty tray table 20 is lifted by the amount equal to the predetermined stroke by means of the vertical drive mechanism 26. Finally, the IC elements 5 to be retested are transported onto the trays on the retest tray table 75.

Every time the retest tray table 75 is moved by the horizontal drive unit 77, the position of the table 75 is memorized in the memory in the controller 29. Thus, when an IC element to be tested is detected, the retest tray table 75 is always moved over the unaccepted tray table 76 and allows the retest tray 4a to receive the IC elements to be tested.

As the IC elements on the top trays on the table 14 of the loader 8 are tested and the top trays become empty, they are transported onto the empty tray table 20 by means of the third robot arm 22. When the trays on the accepted IC element tray table 74 are filled with the tested IC elements, empty trays are transported from the empty tray table 20 onto the accepted IC element tray table 74 by means of the third robot arm 22.

When the trays on the unaccepted IC element tray table 76 are filled with unaccepted IC elements, the third robot arm 22 picks up trays on the empty tray table 20 and waits at the picked-up position. During waiting, retest tray table 75 is moved onto the empty tray table 20 by means of the horizontal drive unit 77 to open the space over the unaccepted IC tray table 76. Thereafter, empty trays held by the third robot arm 22 are transmitted onto the unaccepted IC element tray table 76.

Figure 8:
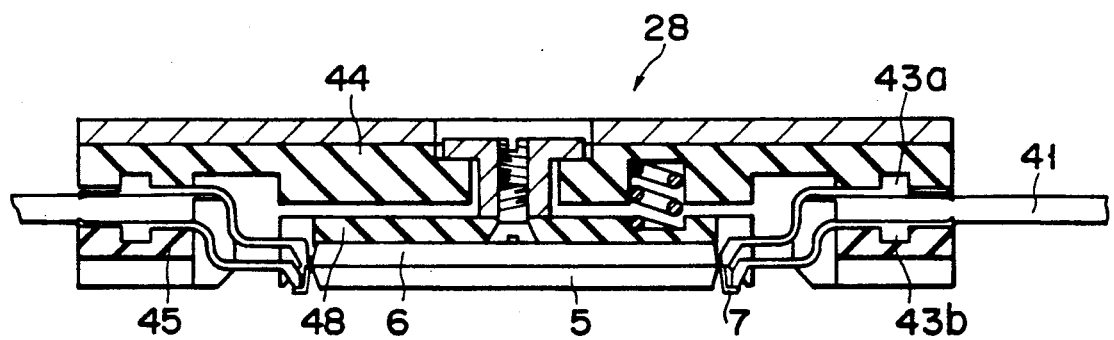
FIG. 8 is a longitudinal cross-sectional view of a modification of the contact unit in the IC testing section.

FIG. 8 shows a modification of the contact section of the IC element testing apparatus according to this invention. Two probes 43a and 43b are joined to the upper surface and the undersurface of each probe card 41, respectively. The probes 43a and 43b constitute a force side probe and a sense side probe and are connected to a four-terminal tester (not shown). In this modification, the tip of the upper probe 43a contacts the root of a lead 7 and the tip of the lower probe 43b contacts the vicinity of the tip portion of the lead 7. The other structure is the same as that of the above-mentioned embodiment.

In the IC element testing apparatus according to this invention, only the tip portion 42b of the probe 42 contacts the root 7b of a lead 7. This prevents the lead from being bent during the test.

The tip portion 7a of a lead 7 provided in a substrate is not damaged by a probe 42, and thus the surface of the tip portion 7a is maintained smooth.

Since it is unnecessary to replace the whole contact probes 42 unlike the conventional socket type IC handler but only a broken probe 42 is replaced by a new one when the probe 42 is broken, the maintenance of the IC element testing apparatus according to this invention can be made at a lower cost than that of the conventional IC handler.

In the above described IC element testing apparatus, IC elements are checked one by one. However, the apparatus may be constructed such that a plurality of IC elements are tested simultaneously.

This invention is not limited to the above-mentioned embodiments but various modifications are available within the scope of this invention.

What is claimed is:

1. An apparatus for testing IC elements each having a mold and leads, comprising:
   holding means for holding an IC element;
   contact section having probes to be contacted with leads of said IC element and supporting means for supporting said probes;
   contact means for moving at least one of said holding means and said contact section to cause them to approach each other and contacting said leads of said IC element to said probes; and
   a mold guide provided adjacent said supporting means and movable toward said supporting means, said mold guide comprising an edge portion formed with grooves for receiving said probes and aligning means for aligning said IC element with said mold guide when said leads are contacted with said probes.

2. The apparatus according to claim 1, further comprising urging means disposed between said supporting means and said mold guide, for urging said mold guide in a direction opposite to a direction in which said mold guide is moved.

3. The apparatus according to claim 1, wherein each of said probes has a tip portion received in one of said grooves of said mold guide and projecting from said groove when said mold guide is moved toward said supporting means.

4. The apparatus according to claim 1, wherein said aligning means has a bottom face and inner faces both formed in said mold guide and contacting said mold of said IC element.

5. The apparatus according to claim 1, wherein said mold guide has as many of said grooves as said leads of said IC element.

6. The apparatus according to claim 1, wherein each of said probes has a contact face of 60 to 200 μm square.

7. The apparatus according to claim 1, wherein each of said probes has a contact face inclining at an angle of 3° to 10° with respect to a surface of each of said leads.

8. The apparatus according to claim 1, wherein each of said probes has a contact face inclining at an angle of substantially 5° with respect to a surface of each of said leads.

9. The apparatus according to claim 1, wherein each of said probes comprises an elongated shaft portion, a tip portion having a contact face for contacting with each of said leads of said IC element, and a crank portion provided between said shaft portion and said tip portion.

10. The apparatus according to claim 9, wherein said crank portion of said probe is made bendable in a space formed in said supporting means.

11. The apparatus according to claim 1, wherein each of said probes comprises a pair of pin elements.

12. The apparatus according to claim 1, wherein said contact means has lift means for lifting said holding means.

13. The apparatus according to claim 1, further comprising means for adjusting a relative position between said holding means and said contact section.

14. The apparatus according to claim 13, wherein said adjusting means includes an X-Y-Z-θ table.

15. The apparatus according to claim 1, further comprising testing means connected to said probes, for testing electrical characteristics of said IC element.

16. The apparatus according to claim 1, wherein said contact means includes a moving mechanism for moving said holding means, and said aligning means including a bottom face and an inner face of said mold guide.

17. An apparatus for testing IC elements each having a mold and leads, comprising:
   holding means for holding an IC element;
   a contact section having probes to be contacted with leads of said IC element and supporting means for supporting said probes;
   lift means for lifting said holding means, causing said holding means to approach said contact section and causing said leads to contact said probes;
   a mold guide provided adjacent said supporting means and movable toward said supporting means; and
   urging means disposed between said supporting means and said mold guide, for urging said mold guide in a direction opposite to a direction in which said mold guide is moved,
   said mold guide including an edge portion formed with grooves for receiving said probes and aligning means for aligning said IC element with said mold guide when said leads are contacted with said probes, and
   each of said probes having a tip portion received in one of said grooves of said mold guide, said tip portion projecting from said groove when said mold guide is moved toward said supporting means.

18. The apparatus according to claim 17, wherein said aligning means has a bottom face and inner faces both formed in said mold guide and for contacting said mold of said IC element.

19. The apparatus according to claim 17, wherein said mold guide has as many of said grooves as said leads of said IC element.

20. The apparatus according to claim 17, wherein each of said probes has a contact face of 60 to 200 μm square.

21. The apparatus according to claim 17, wherein each of said probes has a contact face inclining at an angle of 3° to 10° with respect to a surface of each of said leads.

22. The apparatus according to claim 17, wherein each of said probes has a contact face inclining at an angle of substantially 5° with respect to a surface of each of said leads.

23. The apparatus according to claim 17, wherein each of said probes comprises an elongated shaft portion, a tip portion having a contact face for contacting with each of said leads of said IC element, and a crank portion provided between said shaft portion and said tip portion.

24. The apparatus according to claim 23, wherein said crank portion of said probe is made bendable in a space formed in said supporting means.

25. The apparatus according to claim 17, wherein each of said probes comprises a pair of pin elements.

26. The apparatus according to claim 17, further comprising means for adjusting a relative position between said holding means and said contact section.

27. The apparatus according to claim 17, wherein each of said probes has a tip portion for contacting with a root portion of each of said leads.

28. The apparatus according to claim 26, wherein said adjusting means includes an X-Y-Z-$\theta$ table.

29. The apparatus according to claim 17, wherein said lift means includes a moving mechanism for moving said holding means, and said aligning means includes a bottom face and an inner face of said mold guide.

* * * * *